United States Patent [19]

Zielinski

[11] Patent Number: 4,786,758
[45] Date of Patent: Nov. 22, 1988

[54] DOOR SHIELD FOR SHIELDED ENCLOSURE

[75] Inventor: Stanley J. Zielinski, Addison, Ill.

[73] Assignee: The Curran Company, Addison, Ill.

[21] Appl. No.: 930,875

[22] Filed: Nov. 14, 1986

[51] Int. Cl.$^4$ ............................................. H05K 9/00
[52] U.S. Cl. ........................... 174/35 GC; 174/35 MS
[58] Field of Search ..................... 174/35 GC, 35 MS; 361/424; 219/10.55 D; 49/482, 483, 493, 496

[56] References Cited

U.S. PATENT DOCUMENTS

| | | | |
|---|---|---|---|
| 1,642,176 | 9/1927 | Schnake | 49/483 |
| 1,666,328 | 4/1928 | Dennis | 49/496 |
| 2,066,910 | 1/1937 | Canales | 49/493 |
| 3,504,095 | 3/1970 | Roberson et al. | 174/35 GC |
| 4,069,618 | 1/1978 | Geiss | 174/35 MS |
| 4,623,752 | 11/1986 | Steen et al. | 174/35 MS |
| 4,631,641 | 12/1986 | Brombal et al. | 361/424 |
| 4,652,695 | 3/1987 | Busby | 174/35 GC |
| 4,659,869 | 4/1987 | Busby | 174/35 GC |

FOREIGN PATENT DOCUMENTS 1179975 2/1970 United Kingdom .......... 174/35 GC

OTHER PUBLICATIONS

Erik A. Lindgren, "Contemporary RF Enclosures", Mar. 1967, p. 100.

Primary Examiner—Arthur T. Grimley
Assistant Examiner—David A. Tone
Attorney, Agent, or Firm—Mason, Kolehmainen, Rathburn & Wyss

[57] ABSTRACT

A shield for the gap surrounding the door of an enclosure shielded against electromagnetic interference (EMI). The shield includes an elongated base having angularly related mounting and support flange portions adjustable by deformation to tailor the base to the gap. The mounting flange portion is adjustably clamped to the door face to hold the support flange portion in the gap. A finger assembly includes numerous fingers with first ends fixed to the base, second ends slidable on the support flange portion and contact portions engageable with the door frame.

11 Claims, 1 Drawing Sheet

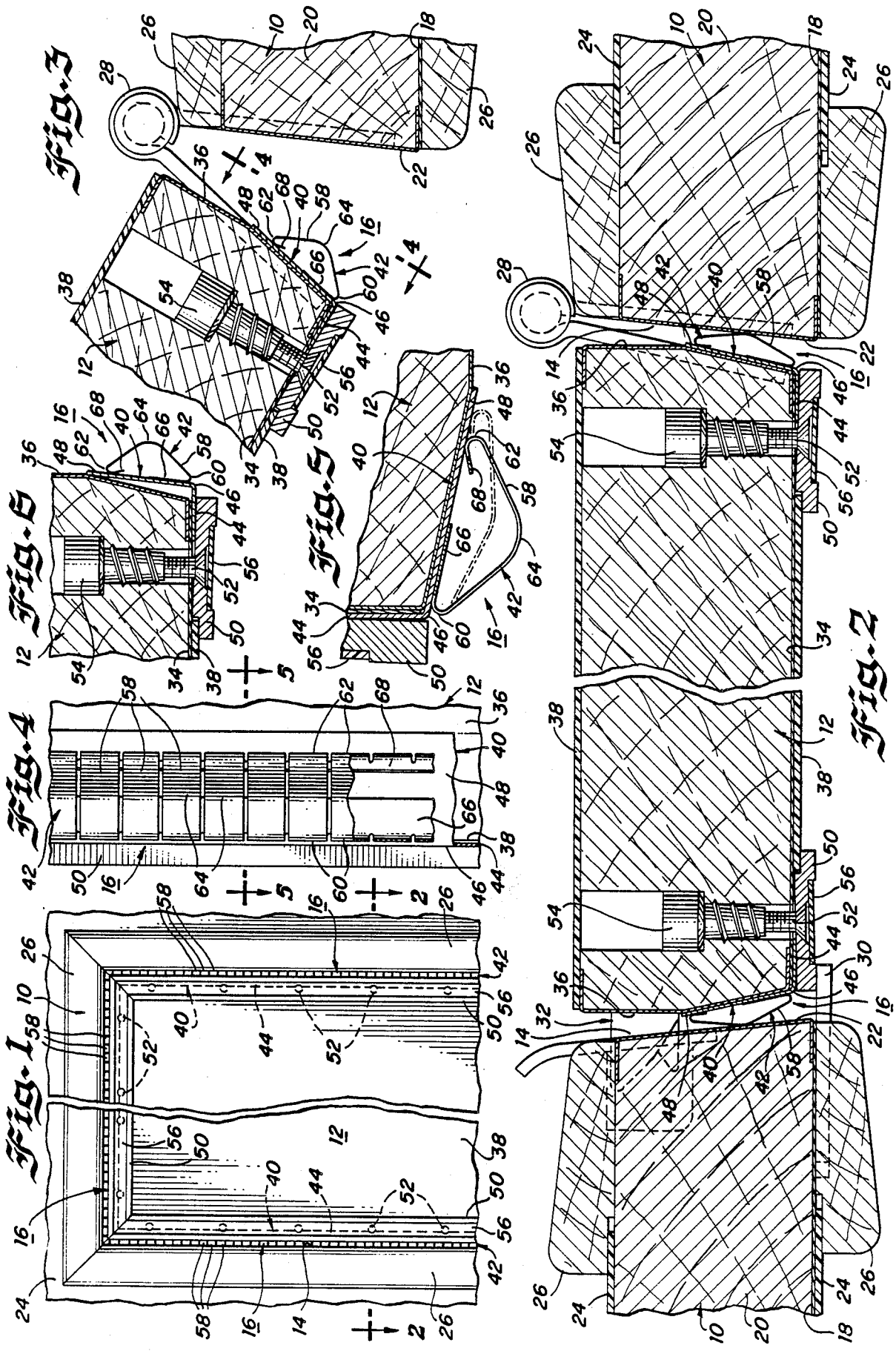

DOOR SHIELD FOR SHIELDED ENCLOSURE

The present invention relates to electromagnetic interference (EMI) shielding and more particularly to a shield for a door of a shielded enclosure.

Shielded enclosures are used to attenuate interference from electromagnetic radiation such as radio frequency radiation and the like. Such enclosures may be provided in the form of rooms or other structures to meet shielding requirements of operation or testing of sensitive electronic equipment and applications such as hyperthermia, laser alchemistry, nuclear magnetic resonance, and a variety of others. Shielded enclosures in use at the present time may include a single shield or multiple shields of electrically conductive metal and/or metal mesh or screen entirely enclosing a shielded space.

A door is usually provided for access to a shielded enclosure by personnel. Other types of doors such as movable or removable panels may be desirable for various circumstances. In order to maintain the integrity of the shield, such doors are themselves shielded and the gap between the door and its surrounding frame must be shielded when the door is closed. A typical door shield used in the past includes flexible contact elements mounted on the door and connected to the shielding of the door. In the closed position, the contact elements engage the enclosure shield at the door frame. Known arrangements have been difficult to install and difficult to replace if damaged. In addition, known door shields have not been easily adjustable for particular door installations, have interfered with easy opening and closing of the door and have not consistently achieved a desired high level of shielding efficiency.

Among the principal objects of the present invention are to provide an improved door shield for the gap between the door and frame of a shielded enclosure; to provide a door shield achieving a high level of shielding efficiency; to provide a door shield that is easy to install and easy to replace; to provide a door shield that can be adjusted to meet the requirements of many specific door installations; to provide a door shield that does not interfere with the opening and closing of the door; and to provide a door shield overcoming disadvantages of those used in the past.

In brief, in accordance with the above and other objects and advantages of the present invention, there is provided an electromagnetic interference shield for the gap between the adjacent edges of a door and door frame of a shielded enclosure. The shield includes an elongated base including a mounting flange portion and a support flange portion extending at an angle. The mounting flange portion is mounted on the door or the frame to hold the support flange portion in the gap. The base is electrically conductive and can be deformed to change the angle between the mounting and the supporting flange portions to configure the base properly for the gap.

The base carries a plurality of resilient, electrically conductive fingers along its length. Each finger has end segments in engagement with the base and a central contact segment engageable with the door or frame when the door is closed. One of the end segments of each finger is fixed to the base and the other is slidable on the support flange portion.

The present invention may be best understood with reference to the following detailed description of the embodiment of the invention shown in the accompanying drawing wherein:

FIG. 1 is a fragmentary front elevational view of a shielded enclosure door frame and door provided with a shield constructed in accordance with the present invention;

FIG. 2 is a sectional view taken along the line 2—2 of FIG. 1 on an enlarged scale;

FIG. 3 is a fragmentary view similar to part of FIG. 2 illustrating the door in an open condition;

FIG. 4 is an elevational view, partly broken away, of the door shield viewed from the line 4—4 of FIG. 3;

FIG. 5 is a sectional view taken along the line 5—5 of FIG. 4;

FIG. 6 is a fragmentary sectional view similar to a part of FIG. 3 illustrating the adjustable mounting of the door shield.

Referring now to the drawing, there is illustrated a door frame 10 and a door 12 of a shielded enclosure not otherwise shown. A gap 14 around the door 12 within the door frame 10 is shielded in accordance with the present invention by an improved door shield generally designated as 16.

Shield 16 of the present invention may be employed with shielded enclosures such as boxes, rooms or the like of many different configurations and types. Moreover, the shield 16 may be used with doors of many types, serving many purposes. Thus, the term "door" is used herein does not have the limited meaning of a door for a doorway providing access for personnel.

The enclosure of which a part is shown in the drawing for purposes of illustration is of the single shielded type including suitable support or frame members, wall, floor and ceiling panels and the like enclosing a space entirely shielded by a single sheet or layer of shielding material 18. In the illustrated enclosure, material 18 is a conductive metallic sheet, for example, copper. The door frame 10 receiving the door 12 is defined by door frame members 20. As best seen in FIG. 2, shielding 18 extends across the face of the door frame members where it intimately contacts continuous door edge shielding members 22. If desired, some or all of shielding 22 might be integral and continuous parts of shielding 18. For an attractive appearance, decorative panels or laminates 24 and door casing trim members 26 are employed.

Door 12 can be of solid core construction or of hollow or honeycomb core construction as desired. In the illustrated embodiment of the invention, hinges 28 permit the door to be opened and closed, and a door stop member 30 and door latch assembly 32 retain the door in the closed position illustrated in FIGS. 1 and 2.

The door 12 is provided with continuous shielding in the form of a metal panel 34, for example of copper, covering the entire surface of one side of the door. The edges of the door are covered with door edge shielding members 36 in continuous intimate contact with the door shielding 34. If desired, some or all of the door edge shielding 36 may be integral and continuous with shielding 34. To provide an attractive appearance, the faces of the door are covered with decorative panels or laminates 38.

In accordance with the present invention, the door shield 16 maintains the electrical integrity of the shielding system at the gap 14 when the door 12 is closed in the door frame 10. In general, the door shield 16 includes a base 40 carrying a resilient finger assembly 42. The base 40 and the manner in which it is mounted permit the shield 16 to be tailored to any specific door installation, while the finger assembly 42 provides a high degree of shielding without undue interference with operation of the door.

Base 40 is an elongated element having essentially the same cross section throughout its length. It includes a mounting flange portion 44 joined at a corner 46 to a support flange portion 48. The flange portions 44 and 46 extend at an angle from one another.

In order to permit the installation of the door shield 16 to be tailored to any specific door gap configuration, the base 40 is made of a material which is not only electrically conductive but also is substantially non-resilient and deformable. One suitable material is phosphor bronze. For a relatively narrow gap 14 such as shown in the drawings, the angle between the flange portions 44 and 48 is adjusted so that these portions lie flat against the door shielding 34 and door edge shielding 36 respectively. This type of installation is shown in FIGS. 2-4 of the drawings. If gap 14 is larger, the deformable nature of the material of base 40 permits the angle between flange portions 44 and 48 to be adjusted as shown in FIG. 6 so that the flange portion 48 is spaced from and does not lie flat against the door edge shielding 36. Thus, even with a large gap, the finger assembly 42 is properly positioned relative to the opposing frame edge shielding 22.

In the embodiment of the invention illustrated in the drawing, the shield 16 is attached to the door 12 for engagement with the door frame 10. If desired the shield may be mounted upon the door frame 10 for engagement with the door 12.

Shield 16 is secured to the door 12 by clamp members 50. Members 50 are secured in place by means of screw fasteners 52 threaded into T-nut type fasteners 54 carried by door 12. A removable decorative trim strip 56 normally covers the heads of fasteners 52.

When shield 16 is installed, the mounting flange portion 44 is received under the clamp member 50 and the fasteners 52 are tightened to hold the door shield 16 in place with flange portion 44 in intimate contact against door shielding 34. The clamping arrangement cooperates with the deformable nature of the base 40 to tailor the installation to any particular door gap configuration. As seen by a comparison of FIG. 3 and FIG. 6, the clamp member 50 permits the mounting flange portion 44 to be secured in any desired continuously variable position.

Another important advantage of this mounting arrangement is that the door shield 16 or any section thereof can easily be removed and replaced if, for example, it is damaged or deformed. Preferably the door shield 16 is provided in discrete lengths of a convenient size such as, for example, 18 inches. Thus, if the finger assembly 42 is impaired at a given location by trapping an object in the door gap or the like, the damaged section can be removed and replaced by releasing and then retightening the corresponding clamp member 50.

In contrast to base 40, the finger assembly 42 is formed of a resilient material such as beryllium copper having spring characteristics. Finger assembly 42 includes numerous resilient, spring contact fingers 58 each extending in a direction perpendicular to the longitudinal axis of the door shield 16. Each finger 58 includes end portions 60 and 62 and a central contact portion 64. The fingers are generally arch shaped with the ends 60 and 62 at the bases of the arch and with the contact portion 64 at its peak or top. The ends 60 and 62 are in engagement with the support flange portion 48. When the door is closed, the central contact portion 64 contacts the edge of the door frame 10 with a resilient, spring contact action.

A continuous web element 66 is integral with and interconnects the ends 60 of the fingers 58. This web is fixed to the base 40. In the illustrated arrangement, the web 66 is attached by continuous soldering to the support flange portion 48 adjacent the corner 46. This attachment permits the door shield 16 to be handled and installed as a unit.

The opposite ends 62 of the fingers 58 are in sliding, continuous resilient contact with the support flange portion 48. The door open condition of the finger assembly 42 is shown in FIG. 3 or FIG. 6. As the door is moved from this open condition to a closed condition shown in FIG. 2 and in broken lines in FIG. 5, the finger ends 62 slide across the support flange portion 48. At the same time, as the arch shape of the fingers 58 is flattened, the central contact portion 64 slides across the surface of the door frame edge shielding 22. This sliding action occurs around the full extent of the door 12, although more sliding takes place at the region opposite from the hinges since more relative movement occurs. Sliding contact at the contact portion 64 and at the finger ends 62 provides a desirable self-cleaning, wiping contact action assuring low resistance electrical contact with the door shield 16.

The ends 62 of fingers 58 are interconnected by a continuous connecting strip or portion 68. This interconnection permits some movement of each finger 58 relative to the others but limits the degree of this relative movement to a desirable amount. One advantage is that each of the fingers 58 receives some support from the adjacent fingers and the likelihood of damage is reduced. The configuration provides resilience and strength while permitting the fingers to conform to variations in the size of the gap 14.

With the door in the closed condition, the shield 16 provides a high degree of shielding to radiation. One of the reasons for this is the fact that essentially two shields in series with one another are created. The portion of the finger assembly 42 between the contact portion 64 and the web 66 provides one layer of shielding due to the intimate connections made between the door edge and the door frame edge. A second layer of protection is provided by the portions of the finger assembly 42 between the contact portions 64 and the end portions 62 of fingers 58.

While the invention has been described with reference to details of the illustrated embodiment, such details are not intended to limit the scope of the present invention as defined in the following claims.

What is claimed is:

1. An electromagnetic interference shielded enclosure comprising relatively movable door and door frame members defining a gap between said relatively movable members and a shield for said gap including:
   an elongated base member of electrically conductive material including a mounting flange portion and a support flange portion extending at an angle from said mounting flange portion;
   said mounting flange portion being mountable upon a first of said relatively movable members to hold said support flange portion in the gap between the relatively movable members;
   a finger contact member permanently attached to said base member and including a plurality of resilient electrically conductive fingers arrayed along the length of said base member to establish electrical contact between the relatively movable members;

each finger having spaced first and second end segments in engagement with said support flange portion and a contact segment between said end segments engageable with the second of said relatively movable members;

the first of said end segments of each finger being fixed to said base member and the second of said end segments being slidable on said support flange portion; and connecting portions joining the second end segments of said fingers to limit the freedom of movement of each finger relative to the other fingers.

2. A shielded enclosure as defined in claim 1, said finger contact member comprising a single elongated strip of metal, the fingers being parallel to one another and each extending generally perpendicular to the longitudinal axis of the strip.

3. A shielded enclosure as defined in claim 2, said strip including a continuous web element integral with the first end segments of said fingers, said web element being secured to said base member.

4. A shielded enclosure as defined in claim 3, said web element being secured to said support flange portion.

5. A shielded enclosure as defined in claim 1, each finger being generally arch shaped with said end segments forming the bases of the arch and said contact segment forming the peak of the arch.

6. A shielded enclosure as defined in claim 1, said base member being generally L-shaped throughout its length with said mounting and support flange portions forming the legs of the L, said mounting flange portion being mountable to the face of said one relatively movable member adjacent its edge.

7. A shielded enclosure as defined in claim 6, further comprising a clamp member engageable with said mounting flange portion to hold said mounting flange portion in a selected position relative to the edge of the second relatively movable member.

8. A shielded enclosure as defined in claim 1, said base member being adjustable to vary said angle of said flange portions in accordance with the configuration of the gap.

9. A shielded enclosure as defined in claim 8, said base member being formed of a deformable substantially non-resilient material.

10. An electromagnetic interference shielded enclosure comprising relatively movable door and door frame members defining a gap between said members, and a shield for said gap including:

an elongated base of electrically conductive material including a mounting flange portion and a support flange portion extending at an angle from said mounting flange portion;

said mounting flange portion being mountable upon a first of said members to hold said support flange portion in the gap between the members; and a plurality of resilient electrically conductive fingers arrayed along the length of said base to establish electrical contact between the members;

each fingers having spaced first and second end segments in engagement with said support flange portion and a contact segment between said end segments engageable with the second of said members;

the first of said end segments of each finger being fixed to said base and the second of said end segments being slidable on said support flange portion said base being adjustable to vary said angle of said flange portions in accordance with the configuration of the gap.

11. A shielded enclosure as claimed in claim 10, said base member being formed of a deformable substantially non-resilient material.

* * * * *